(12) United States Patent
Adachi et al.

(10) Patent No.: US 11,996,357 B2
(45) Date of Patent: May 28, 2024

(54) WIRING SUBSTRATE AND METHOD FOR MANUFACTURING WIRING SUBSTRATE

(71) Applicant: IBIDEN CO., LTD., Gifu (JP)

(72) Inventors: Takema Adachi, Ogaki (JP); Daisuke Minoura, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 372 days.

(21) Appl. No.: 17/446,186

(22) Filed: Aug. 27, 2021

(65) Prior Publication Data

US 2022/0077046 A1    Mar. 10, 2022

(30) Foreign Application Priority Data

Sep. 9, 2020 (JP) ................................. 2020-151236
Feb. 1, 2021 (JP) ................................. 2021-014421

(51) Int. Cl.
*H01L 23/498* (2006.01)
*H01L 21/48* (2006.01)

(52) U.S. Cl.
CPC .... *H01L 23/49822* (2013.01); *H01L 21/4857* (2013.01); *H01L 23/49838* (2013.01)

(58) Field of Classification Search
None
See application file for complete search history.

(56) References Cited

U.S. PATENT DOCUMENTS

2005/0100720 A1* 5/2005 Shirai .................... H05K 3/421
                                                          428/209
2020/0357712 A1* 11/2020 Tanaka ................ H01L 23/3171

FOREIGN PATENT DOCUMENTS

JP         2018-172759 A    11/2018

* cited by examiner

*Primary Examiner* — Cory W Eskridge
(74) *Attorney, Agent, or Firm* — Oblon, McClelland, Maier & Neustadt, L.L.P.

(57) ABSTRACT

A wiring substrate includes a first conductor layer, an insulating layer on the first layer such that the insulating layer is covering the first layer, a second conductor layer on the insulating layer such that the insulating layer is formed between the first and second layers, the connection conductors penetrating through the insulating layer and connecting the first and second layers, and a coating film formed at least partially on surface of the first layer such that the film improves adhesion between the first layer and insulating layer. The first layer includes pads and wiring patterns such that the pads are in contact with the connection conductors and that the patterns have surfaces facing the insulating layer and covered by the film, and the pads have roughened surfaces facing the insulating layer and having first surface roughness that is higher than second surface roughness of the surfaces of the patterns.

20 Claims, 11 Drawing Sheets

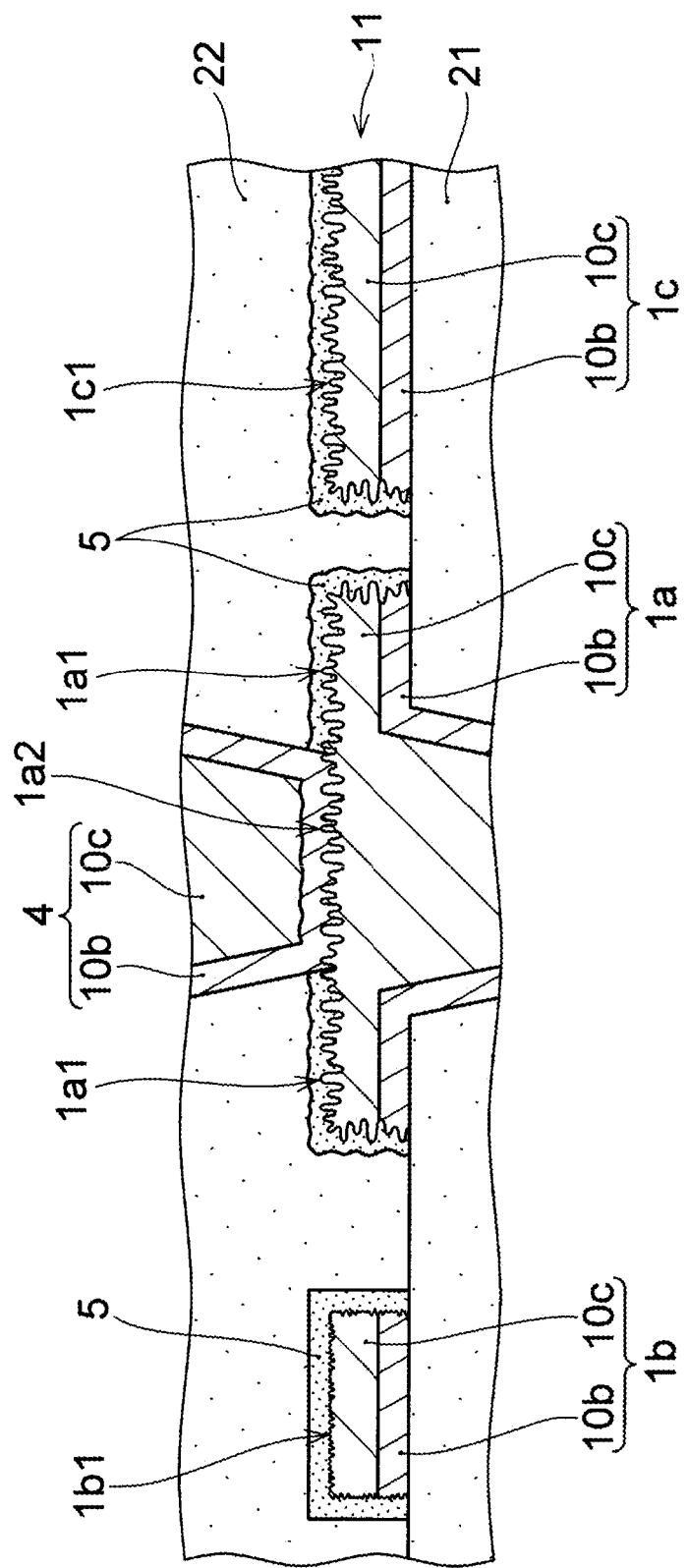

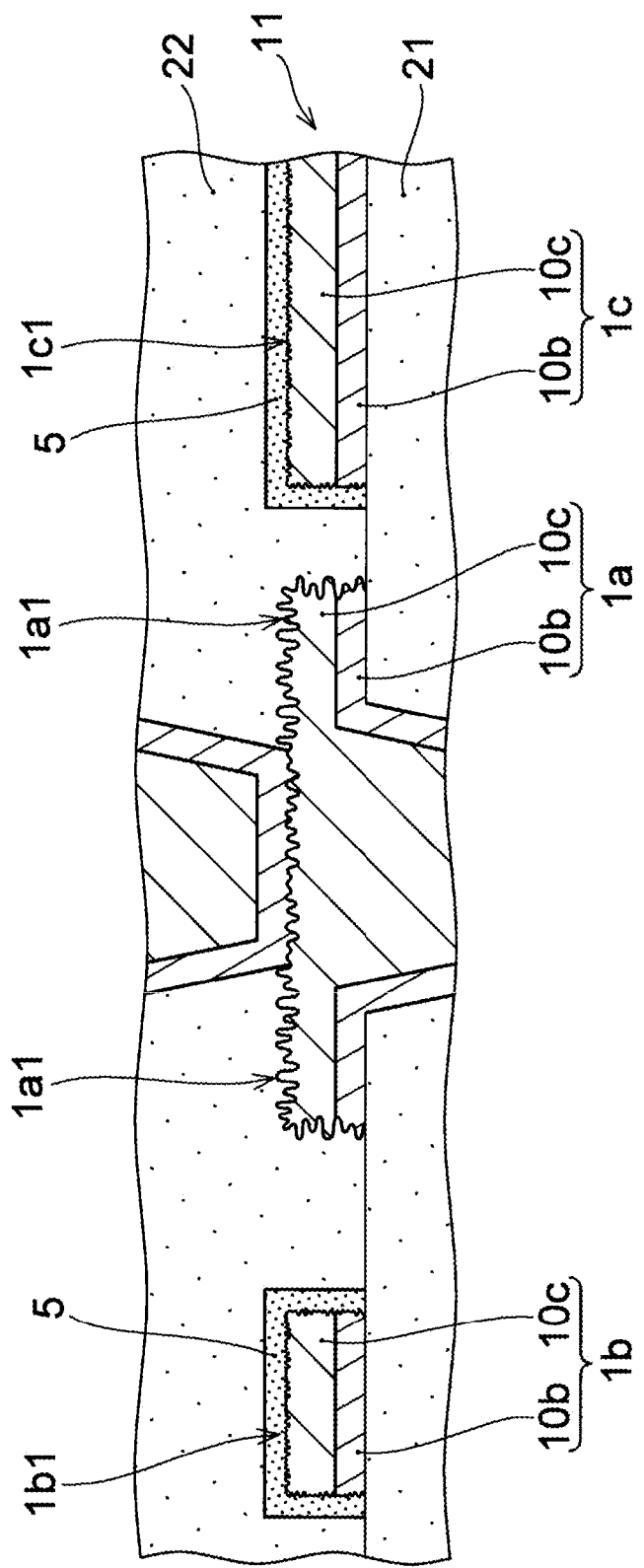

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Applications No. 2020-151236, filed Sep. 9, 2020 and No. 2021-014421 filed on Feb. 1, 2021, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. 2018-172759 describes that, in a printed wiring board, a chemical conversion coating film is formed on a low-roughened or non-roughened surface of a metal wiring layer, and an insulating resin layer is formed on the metal wiring layer via the chemical conversion coating film. The entire contents of this publication are incorporated herein by reference.

SUMMARY OF THE INVENTION

According to one aspect of the present invention, a wiring substrate includes a first conductor layer, an insulating layer formed on the first conductor layer such that the insulating layer is covering the first conductor layer, a second conductor layer formed on the insulating layer such that the insulating layer is formed between the first and second conductor layers, connection conductors formed in the insulating layer such that the connection conductors are penetrating through the insulating layer and connecting the first conductor layer and the second conductor layer, and a coating film formed at least partially on a surface of the first conductor layer such that the coating film improves adhesion between the first conductor layer and the insulating layer. The first conductor layer includes conductor pads and wiring patterns such that the conductor pads are in contact with the connection conductors respectively and that the wiring patterns have surfaces facing the insulating layer and covered by the coating film, and the first conductor layer is formed such that the conductor pads have roughened surfaces facing the insulating layer and having a first surface roughness that is higher than a second surface roughness of the surfaces of the wiring patterns.

According to another aspect of the present invention, a method for manufacturing a wiring substrate includes forming a first conductor layer including conductor pads and wiring patterns, roughening an exposed surface of the first conductor layer including the conductor pads and the wiring patterns, forming a coating film on at least a part of the exposed surface of the first conductor layer including the conductor pads and the wiring patterns, forming an insulating layer such that the insulating layer covers the first conductor layer and the coating film, and forming a second conductor layer on the insulating layer such that the insulating layer is formed between the first and second conductor layers, and forming connection conductors such that the connection conductors penetrate through the insulating layer and connect the conductor pads and the second conductor layer. The roughening of the exposed surface of the first conductor layer includes roughening exposed surfaces of the conductor pads without roughening exposed surfaces of the wiring patterns.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5A is a cross-sectional view illustrating another example of a wiring substrate according to an embodiment of the present invention;

FIG. 5C is a cross-sectional view illustrating yet another example of a wiring substrate according an embodiment of the present invention;

DETAILED DESCRIPTION OF THE EMBODIMENTS

Figure 1:
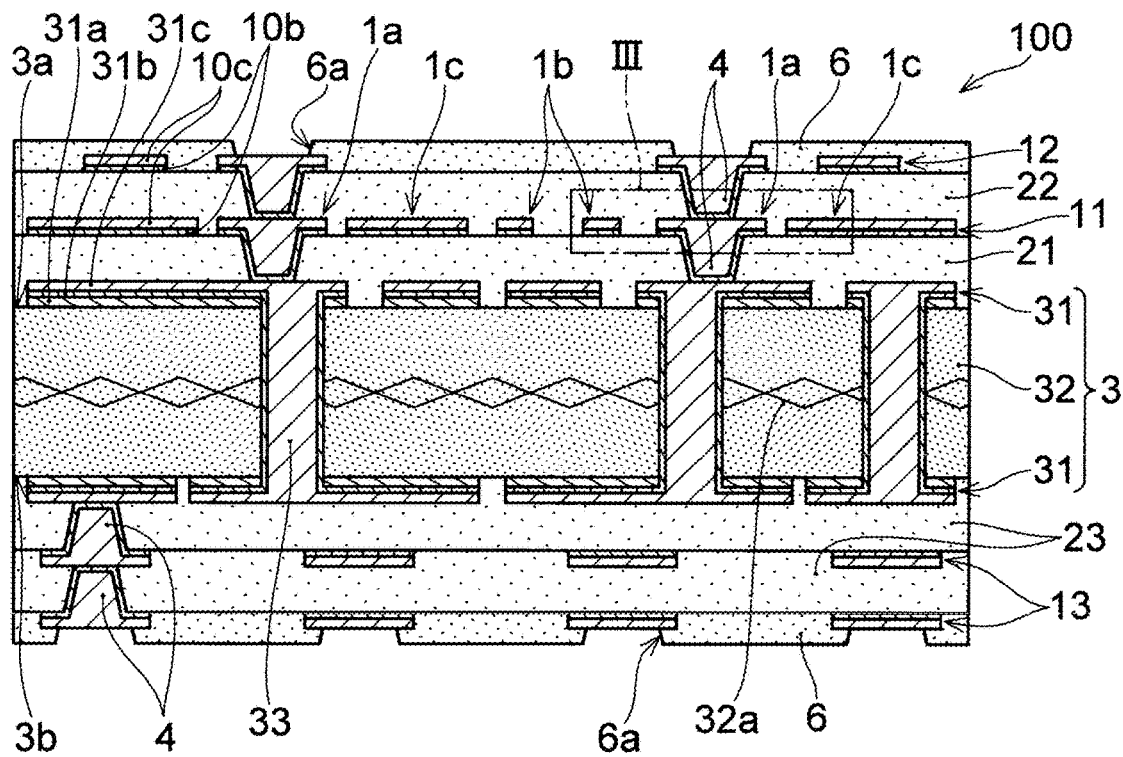
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
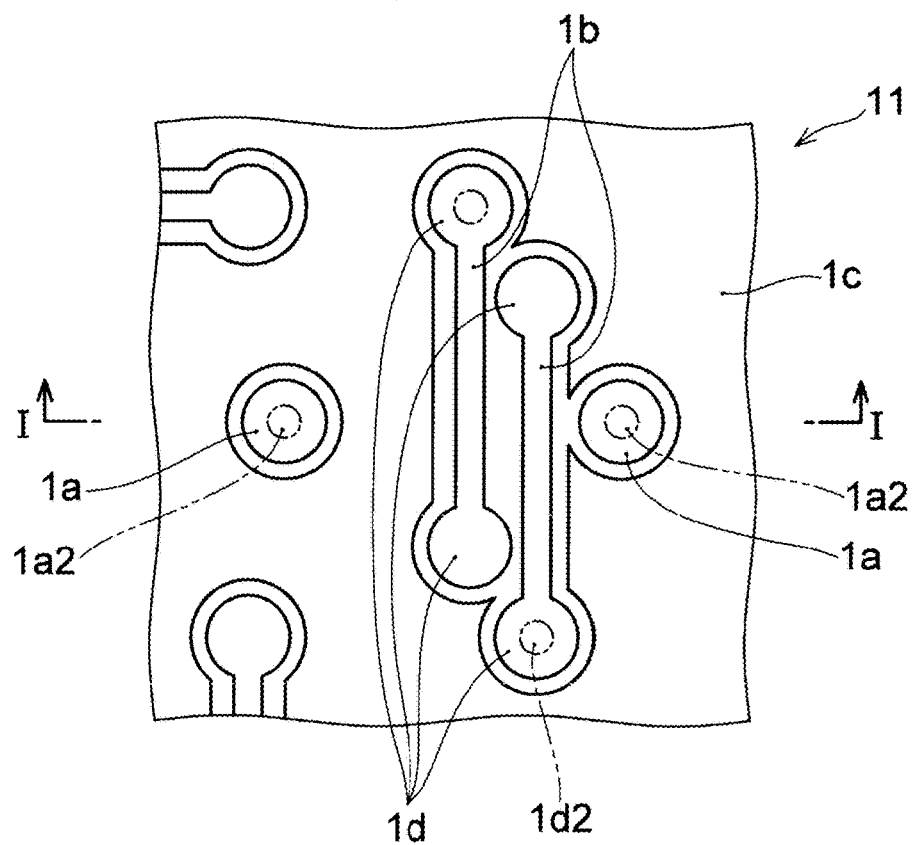
FIG. 2 is a plan view illustrating an example of conductor patterns of a first conductor layer according to an embodiment of the present invention.

A wiring substrate of an embodiment of the present invention is described with reference to the drawings. FIG. 1 is a cross-sectional view illustrating a wiring substrate 100, which is an example of the wiring substrate of the embodiment. FIG. 2 is a plan view illustrating an example of conductor patterns that are a part of a first conductor layer 11 of the wiring substrate 100. FIG. 1 illustrates a cross-sectional view at a cutting line that overlaps an I-I line in FIG. 2. The wiring substrate 100 is merely an example of the wiring substrate of the present embodiment. A laminated structure, the number of conductor layers, and the number of insulating layers of the wiring substrate of the embodiment are not limited to a laminated structure of the wiring substrate 100 of FIG. 1, the number of conductor layers and the number of insulating layers included in the wiring substrate 100.

As illustrated in FIG. 1, the wiring substrate 100 includes a core substrate 3, and insulating layers and conductor layers that are alternately laminated on two main surfaces (a first surface (3a) and a second surface (3b)) of the core substrate 3 opposing each other in a thickness direction of the core substrate 3. The core substrate 3 includes an insulating layer 32, and conductor layers 31 that are respectively formed on both sides of the insulating layer 32.

In the description of the embodiment, a side farther from the insulating layer 32 in a thickness direction of the wiring substrate 100 is also referred to as an "upper side" or simply "upper," and a side closer to the insulating layer 32 is also referred to as a "lower side" or simply "lower." Further, for the conductor layers and the insulating layers, a surface facing the opposite side with respect to the insulating layer 32 is also referred to as an "upper surface," and a surface facing the insulating layer 32 side is also referred to as a "lower surface."

The wiring substrate 100 includes, on the first surface (3a) of the core substrate 3, a first insulating layer 21, a first conductor layer 11, a second insulating layer 22, and a second conductor layer 12, which are laminated in this order from the first surface (3a) side. The first insulating layer 21 covers the first surface (3a) of the core substrate 3, and the second insulating layer 22 covers the first conductor layer 11 and covers the first insulating layer 21 that is exposed without being covered by the first conductor layer 11. The wiring substrate 100 further includes two insulating layers 23 and two conductor layers 13 that are alternately laminated on the second surface (3b) of the core substrate 3.

In each insulating layer, connection conductors are formed that penetrate the each insulating layer and connect conductor layers that are adjacent to each other via the each insulating layer. The first insulating layer 21, the second insulating layer 22, and the two insulating layers 23 each include connection conductors 4. The insulating layer 32 of the core substrate 3 includes connection conductors 33. The connection conductors 33 are so-called through-hole conductors that connect the conductor layers 31 on both sides of the core substrate 3.

The connection conductors 4 are so-called via conductors formed in the insulating layers that are sequentially built up. The connection conductors 4 included in the first insulating layer 21 connect the conductor layer 31 and the first conductor layer 11. The connection conductors 4 included in the second insulating layer 22 connect the first conductor layer 11 and the second conductor layer 12. The connection conductors 4 included in the two insulating layers 23 connect the conductor layer 31 and the conductor layer 13 or connect the conductor layers 13.

The first and second insulating layers (21, 22), the insulating layers 23, and the insulating layer 32 are each formed of any insulating resin. Examples of the insulating resin include an epoxy resin, a bismaleimide triazine resin (BT resin), a phenol resin, and the like. In the example of FIG. 1, the insulating layer 32 contains a core material (reinforcing material) (32a) formed of a glass fiber, an aramid fiber, or the like. Although not illustrated in FIG. 1, the insulating layers other than the insulating layers 32 can also each contain a core material formed of a glass fiber or the like. The insulating layers can each further contain inorganic filler (not illustrated in the drawings) formed of fine particles of silica ($SiO_2$), alumina, mullite, or the like.

The first and second conductor layers (11, 12), the conductor layers 13, and the conductor layers 31, and the connection conductors 4 and the connection conductors 33, are each formed using any metal such as copper or nickel. In the example of FIG. 1, the conductor layers 31 each include a metal foil (31a), a metal film (31b), and a plating film (31c). The connection conductors 33 are integrally formed with the conductor layers 31, and are formed by the metal film (31b) and the plating film (31c).

On the other hand, the first and second conductor layers (11, 12) and the conductor layers 13, and the connection conductors 4 are each formed of a metal film (10b) and a plating film (10c). The connection conductors 4 are integrally formed with the first conductor layer 11, the second conductor layer 12, or the conductor layers 13. The plating films (31c, 10c) are, for example, electrolytic plating films. The metal film (31b) and the metal film (10b) are, for example, electroless plating films or sputtering film, and respectively function as power feeding layers when the plating film (31c) and the plating film (10c) are formed by electrolytic plating.

A solder resist 6 is formed on the second insulating layer 22 and the second conductor layer 12. A solder resist 6 is also formed on the surface-side insulating layer 23 and conductor layer 13 on the second surface (3b) side of the core substrate 3. The solder resists 6 are provided with openings (6a) each of which exposes a part of the second conductor layer 12 or a part of the conductor layer 13. The solder resists 6 are each formed of, for example, a photosensitive epoxy resin or polyimide resin, or the like.

The first conductor layer 11, the second conductor layer 12, the two conductor layers 13, and the two conductor layers 31 each include predetermined conductor patterns. The first conductor layer 11 includes conductor pads (1a) and wiring patterns (1b).

The conductor pads (1a) are in contact with the connection conductors 4 that penetrate the second insulating layer 22. That is, the conductor pads (1a) are conductor pads on which the connection conductors 4 are formed, and are so-called receiving pads for the connection conductors 4 that penetrate the second insulating layer 22. Therefore, a portion of a surface of each of the conductor pads (1a) on the second insulating layer 22 side is covered by one of the connection conductors 4 that penetrate the second insulating layer 22. In other words, a portion of the surface of each of the conductor pads (1a) on the second insulating layer 22 side faces a bottom surface of one of the connection conductors 4 that penetrate the second insulating layer 22. In the example of FIG. 1, the connection conductors 4 that penetrate the first insulating layer 21 and the connection conductors 4 that penetrate the second insulating layer 22 are formed to be stacked, and so-called stack via conductors are formed. Therefore, the conductor pads (1a) are provided as so-called via pads of the connection conductors 4 (via conductors) that penetrate the first insulating layer 21.

The wiring patterns (1b) are conductor patterns that function as conductive paths used for transmission of any electrical signals or supply of electric power. Surfaces of the wiring patterns (1b) other than surfaces facing the first insulating layer 21 are covered by the second insulating layer 22. The wiring patterns (1b), for example, may independently, or in cooperation with other conductor patterns, connect predetermined transmission source and transmission destination of electrical signals, or may connect predetermined supply source and supply destination of electric power. The wiring patterns (1b) may be, for example, transmission paths for signals of high frequencies exceeding several GHz.

As illustrated in FIG. 2, two wiring patterns (1b) in the example of FIG. 1 connect two conductor pads (1d) in the first conductor layer 11. Portions (1a2, 1d2) surrounded by two-dot chain lines in the conductor pads (1a, 1d) in the example of FIG. 2 indicate the portions of the surfaces of the conductor pads (1a, 1d) covered by the connection conductors 4 that penetrate the second insulating layer 22. The portions (1a2) are also referred to as "surfaces (1a2) of the conductor pads (1a) covered by the connection conductors 4."

In the example of FIGS. 1 and 2, the first conductor layer 11 further includes a conductor pattern (1c). The conductor pattern (1c) is a conductor pattern having a flat plate-like shape extending over a region where the conductor pads (1a) and the wiring patterns (1b) are not formed. The conductor pattern (1c) may be a so-called solid pattern provided in the first conductor layer 11 so as to substantially fill the region where conductors such as wirings or connection pads other than the conductor pattern (1c) are not formed. The conductor pattern (1c) is used, for example, as a ground potential or a ground plane or a power plane to which a specific power supply potential is applied.

Figure 3:
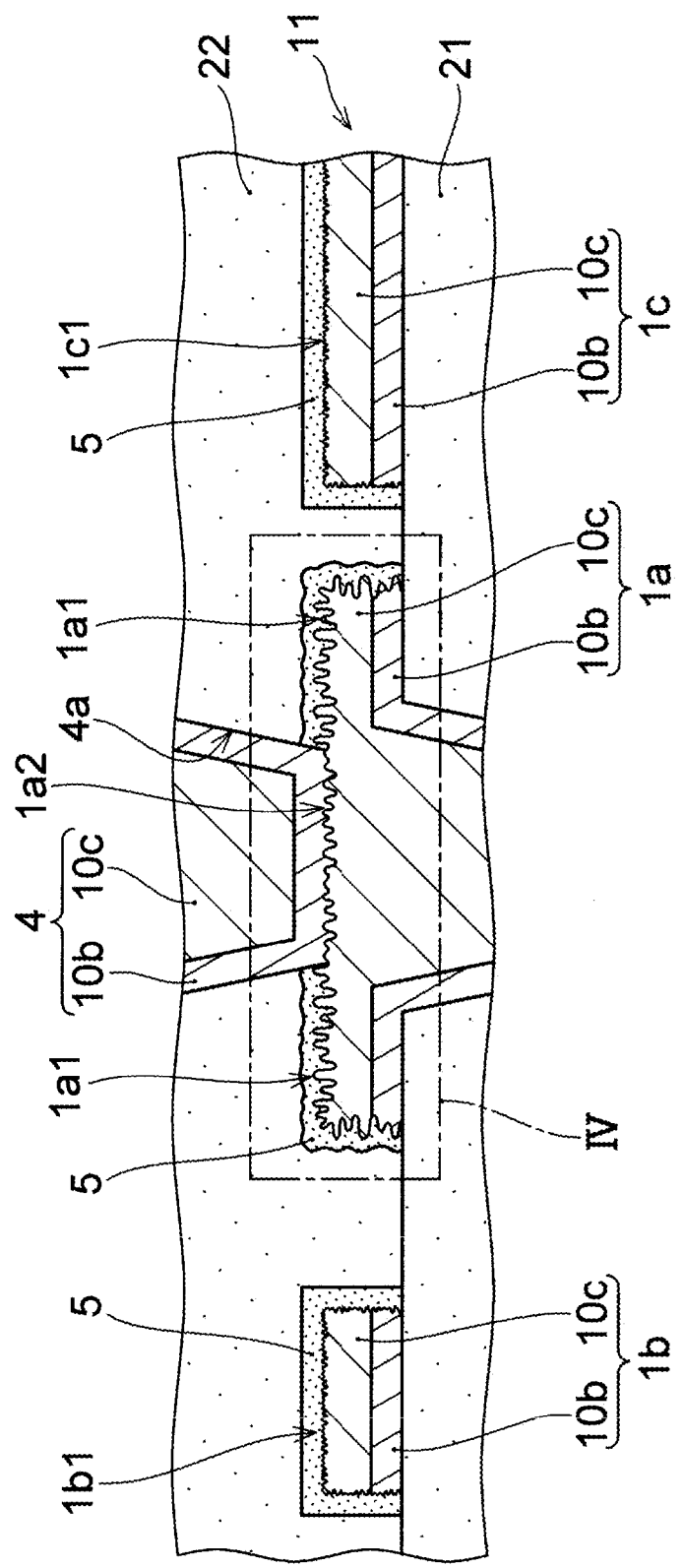
FIG. 3 is an enlarged view of a portion (III) of FIG. 1.
Figure 4:
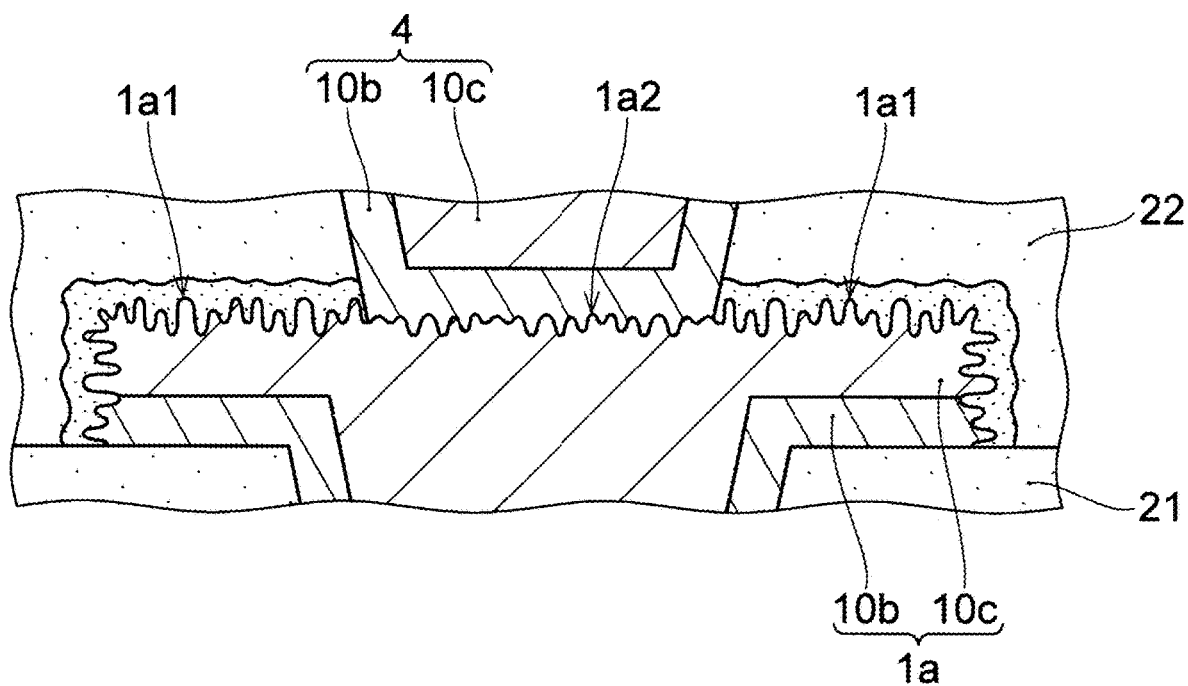
FIG. 4 is an enlarged view of a portion (IV) of FIG. 3.

FIG. 3 illustrates an enlarged view of a portion (III) of FIG. 1. FIG. 4 illustrates a further enlarged view of a portion (IV) of FIG. 3. Although omitted in FIGS. 1 and 2 referenced so far, as illustrated in FIGS. 3 and 4, a coating film 5 is formed on a surface of the first conductor layer 11 facing the second insulating layer 22. That is, the wiring substrate 100 further includes the coating film 5 interposed between the first conductor layer 11 and the second insulating layer 22. "The surface of the first conductor layer 11 facing the second insulating layer 22" means a region of the surface of the first conductor layer 11 facing the second insulating layer 22. Similarly, "surfaces of the conductor pads (1a), the wiring patterns (1b), and the conductor pattern (1c) facing the second insulating layer 22" to be described later respectively mean regions of the surfaces of the conductor pads (1a), the wiring patterns (1b), and the conductor pattern (1c) facing the second insulating layer 22.

Figure 5B:
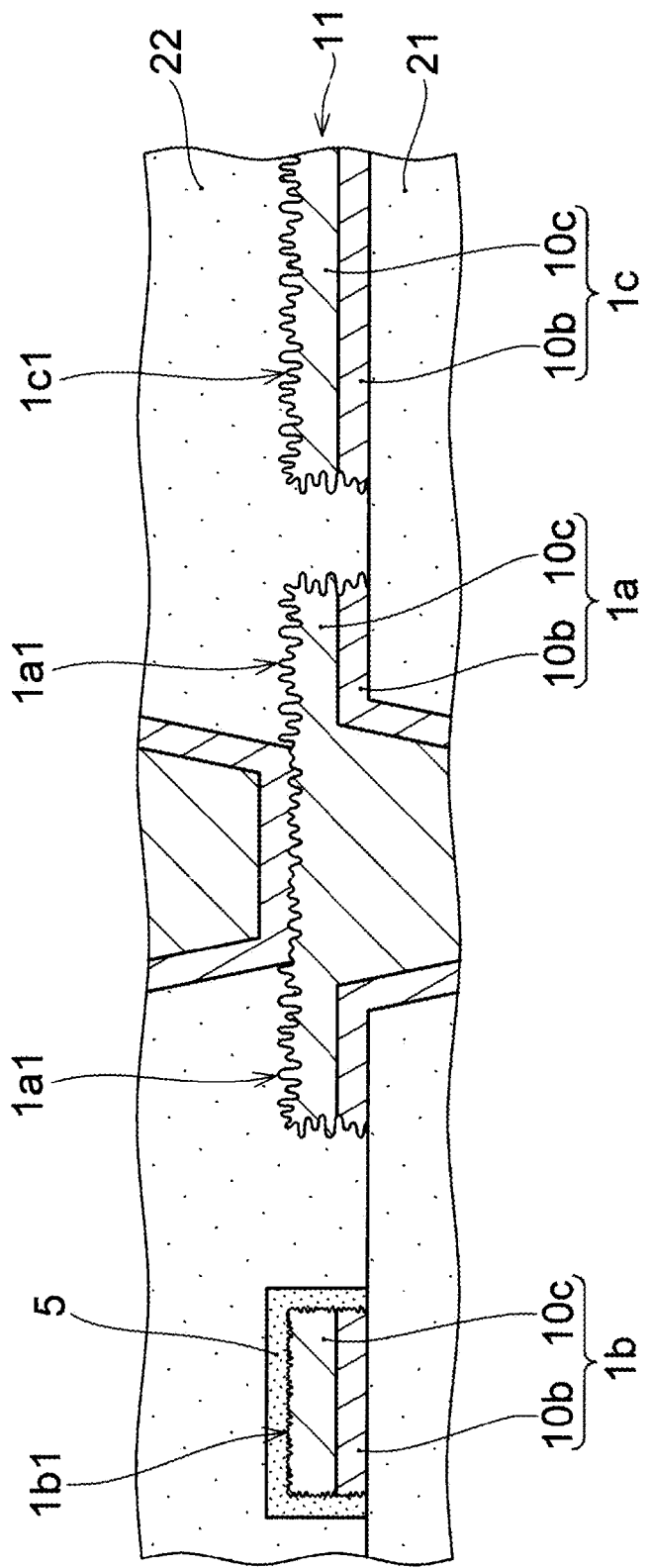
FIG. 5B is a cross-sectional view illustrating yet another example of a wiring substrate according to an embodiment of the present invention.
Figure 5D:
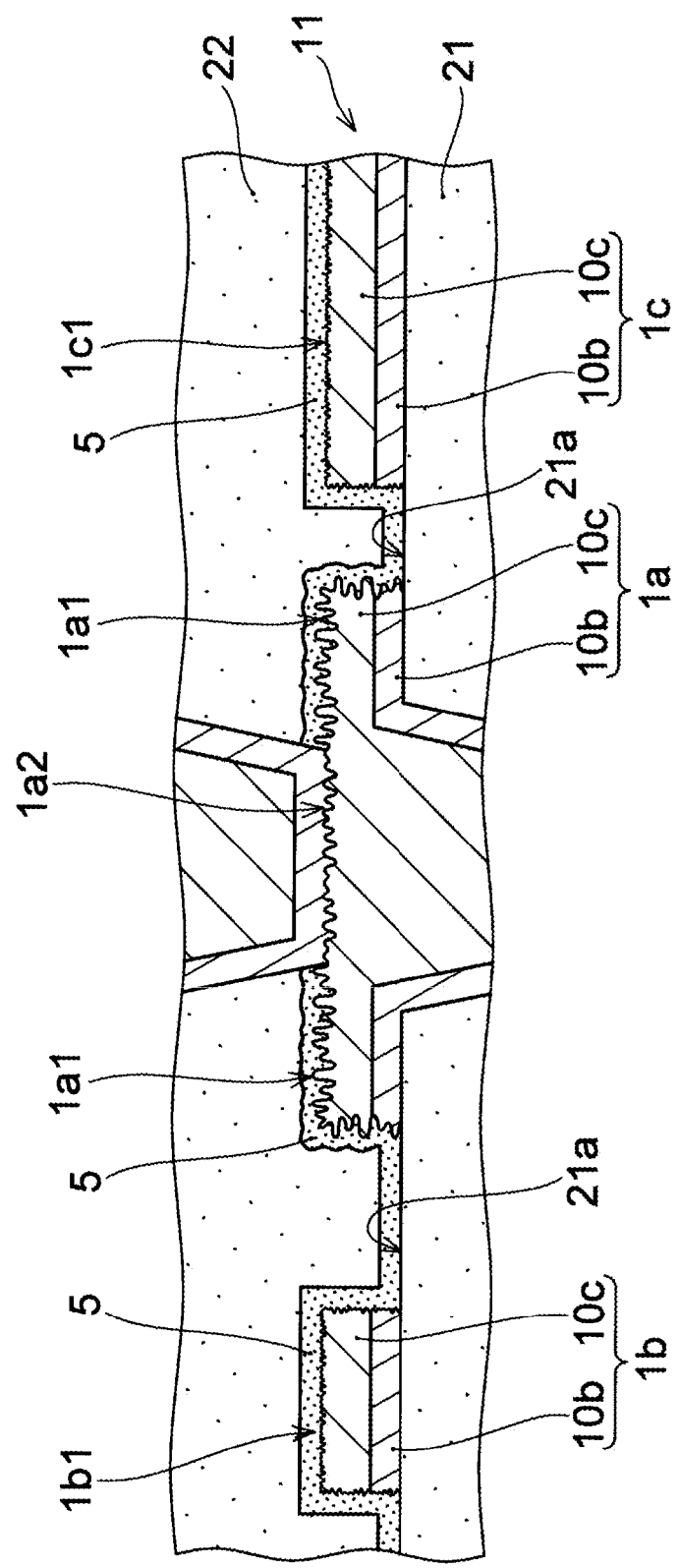
FIG. 5D is a cross-sectional view illustrating yet another example of a wiring substrate according to an embodiment of the present invention.

In the example illustrated in FIG. 3, the coating film 5 is formed on the entire surface of the first conductor layer 11 facing the second insulating layer 22. However, as illustrated in FIG. 5B, to be referenced later, it is also possible that the coating film 5 is formed only on a part of the surface of the first conductor layer 11 facing the second insulating layer 22. That is, the coating film 5 is at least partially formed on the surface of the first conductor layer 11 facing the second insulating layer 22. "The surface of the first conductor layer 11 facing the second insulating layer 22" does not include the portions of the surfaces of the conductor pads (1a) covered by the connection conductors 4 that penetrate the second insulating layer 22.

The coating film 5 improves adhesion between the first conductor layer 11 and the second insulating layer 22. The coating film 5 is formed of, for example, a material that can bind to both an organic material such as a resin forming the second insulating layer 22 and an inorganic material such as a metal forming the first conductor layer 11. The coating film 5 is formed of, for example, a material that contains both a reactive group capable of chemically bonding to an organic material and a reactive group capable of chemically bonding to an inorganic material. Therefore, the conductor patterns of the first conductor layer 11, which are covered by the coating film 5, and the second insulating layer 22 adhere to each other with sufficient strength. An example of a material of the coating film 5 is a silane coupling agent containing an azole silane compound such as a triazole compound. The material of the coating film 5 is not limited to a silane coupling agent as long as the material can increase the adhesion strength between the first conductor layer 11 and the second insulating layer 22 as compared to the case where the second insulating layer 22 is directly formed on the first conductor layer 11.

As illustrated in FIG. 3, in the present embodiment, surfaces (1b1) of the wiring patterns (1b) of the first conductor layer 11 facing the second insulating layer 22 are covered by the coating film 5. That is, as compared to the case where the coating film 5 is absent, the adhesion between the wiring patterns (1b) and the second insulating layer 22 is improved. Therefore, it is considered that floating or peeling off of the second insulating layer 22 from the wiring patterns (1b) is unlikely to occur.

In the example of FIG. 3, the surfaces (1a1) of the conductor pads (1a) facing the second insulating layer 22 and the surface (1c1) of the flat conductor pattern (1c) facing the second insulating layer 22 are also covered by the coating film 5. That is, as compared to the case where the coating film 5 is absent, adhesion between the second insulating layer 22 and each of the conductor pads (1a) and the conductor pattern (1c) is improved. Therefore, it is considered that floating or peeling off of the second insulating layer 22 from the conductor pads (1a) and the conductor pattern (1c) is unlikely to occur.

Although omitted in FIG. 1 referenced above, as illustrated in FIG. 3, the conductor patterns (such as the conductor pads (1a), the wiring patterns (1b), and the conductor pattern (1c)) of the first conductor layer 11 have unevennesses of mutually different degrees on the surfaces that are not in contact with the first insulating layer 21. In other words, the first conductor layer 11 has multiple regions with mutually different surface roughnesses in the surfaces (the surfaces (1a1), the surfaces (1b1), and the surface (1c1)) facing the second insulating layer 22 and the surfaces (1a2) covered by the connection conductors 4. In the example of FIG. 3, recesses of the unevennesses of the surfaces (1a1), the surfaces (1b1) and the surface (1c1) are filled with the coating film 5.

In the first conductor layer 11 illustrated in FIG. 3, a height difference of the unevenness of the surfaces (1a1) of the conductor pads (1a) facing the second insulating layer 22 is larger than a height difference of the unevenness of the surfaces (1b1) of the wiring patterns (1b) facing the second insulating layer 22. The surfaces (1a1) of the conductor pads (1a) have a higher surface roughness (first surface roughness) than the surface roughness (second surface roughness) of the surfaces (1b1) of the wiring patterns (1b). The surfaces (1a1) of the conductor pads (1a) are roughened to have the first surface roughness higher than the second surface roughness. As will be described later, the surfaces (1a1) of the conductor pads (1a) are roughened by, for example, microetching or the like.

On the other hand, the surfaces (1b1) of the wiring patterns (1b) do not have to be roughened in a process that is actively provided for roughening the surfaces (1b1). The unevenness of the surfaces (1b1) may be generated by grain boundaries of the plating film (10c) or unevenness of a surface of plating resist during the formation of the plating film (10c).

In the wiring substrate 100 of the present embodiment, the surfaces (1a1) of the conductor pads (1a) are roughened so as to have a relatively high surface roughness (the first surface roughness). Therefore, it may be possible that peeling between the conductor pads (1a) and the second insulating layer 22 is suppressed. Specifically, unintentional infiltration of a liquid into interfaces between the conductor pads (1a) and the second insulating layer 22 is prevented by the unevenness of the surfaces (1a1) of the conductor pads (1a) having the relatively high first surface roughness. As a result, it may be possible that peeling between the conductor pads (1a) and the second insulating layer 22 that can be caused by such infiltration of a liquid is suppressed.

More specifically, in a manufacturing process of the wiring substrate 100, inner walls of through holes (4a) provided in the second insulating layer 22 for forming the connection conductors 4 may be exposed to various treatment solutions, plating solutions, or the like. Then, these liquids may infiltrate into the interfaces between the conductor pads (1a) and the second insulating layer 22 from the inner walls of the through holes (4a) and cause peeling between the conductor pads (1a) and the second insulating layer 22. However, in the present embodiment, the unintentional infiltration of a liquid that can cause such peeling is prevented by the unevenness of the surfaces (1a1) of the conductor pads (1a) having the relatively high first surface roughness.

On the other hand, the surfaces (1b1) of the wiring patterns (1b) have a surface roughness (the second surface roughness) lower than the first surface roughness of the surfaces (1a1) of the conductor pads (1a). For example, for wiring patterns having highly roughened surfaces, in transmission of high-frequency signals, substantial impedance may increase and transmission characteristics may deteriorate due to influence of a skin effect. Further, for example, for fine wiring patterns of about 10 μm/10 μm ((wiring width)/(wiring interval)) or less, when their surfaces are highly roughened, it may be possible that desired shapes cannot be obtained after roughening with respect to designed wiring widths and thicknesses. However, in the present embodiment, since the surfaces (1b1) of the wiring patterns (1b) have a relatively low surface roughness, at least the second surface roughness lower than the first surface roughness, it is considered that a problem such as deterioration in high frequency transmission characteristics due to a high surface roughness is unlikely to occur.

And, the surfaces (1b1) of the wiring patterns (1b) are covered by the coating film 5 that improves the adhesion between the wiring patterns (1b) and the second insulating layer 22. A so-called anchor effect cannot be sufficiently obtained between a conductor layer having a surface with a relatively low surface roughness and an insulating layer formed on a surface of the conductor layer, and as a result, peeling between the conductor layer and the insulating layer may occur. However, since the surfaces (1b1) of the wiring patterns (1b) of the present embodiment are covered with the coating film 5, it is considered that peeling between the wiring patterns (1b) and the second insulating layer 22 is unlikely to occur.

Further, in the present embodiment, it may be possible that deterioration in quality due to melting of the coating film 5 formed on the surfaces (1a1) of the conductor pads (1a) is prevented by the unevenness of the surfaces (1a1) of the conductor pads (1a). As described above, in a manufacturing process of the wiring substrate 100, the inner walls of the through holes (4a) provided in the second insulating layer 22 can be exposed to various liquids. When a liquid infiltrates into the interfaces between the conductor pads (1a) and the second insulating layer 22, the infiltrated liquid may dissolve the coating film 5 formed on the surfaces (1a1) of the conductor pads (1a). In this case, it is possible that the coating film 5 elutes into the through holes (4a), causing poor connection between the connection conductors 4 and the conductor pads (1a) and causing peeling between the conductor pads (1a) and the second insulating layer 22 at a dissolution site of the coating film 5. However, in the present embodiment, such unintentional infiltration of a liquid that could result in such dissolution of the coating film 5 is prevented by the unevenness of the surfaces (1a1) of the conductor pads (1a) having the relatively high first surface roughness.

Thus, in the wiring substrate 100, good transmission characteristics and sufficient adhesion to the second insulating layer 22 are obtained in the wiring patterns (1b), and in addition, deterioration in quality due to peeling between the conductor pads (1a), which are in contact with the connection conductors 4, and the second insulating layer 22 is suppressed. Thus, according to the present embodiment, it may be possible that desired characteristics of the wiring patterns and the adhesion between the wiring patterns and the insulating layer are ensured, and in addition, deterioration in quality of the wiring substrate due to peeling between the conductor pads, which are in contact with the connection conductors that connect the conductor layers, and the insulating layer is suppressed.

In order to achieve both good high frequency transmission characteristics in the wiring patterns (1b) and reliable prevention of infiltration of a liquid into the interfaces between the conductor pads (1a) and the second insulating layer 22, it is considered that the difference in surface roughness between the surfaces (1a1) of the conductor pads (1a) and the surfaces (1b1) of the wiring patterns (1b) is preferably large. For example, the surface roughness (first surface roughness) of the surfaces (1a1) of the conductor pads (1a) is 100% or more higher than the surface roughness (second surface roughness) of the surfaces (1b1) of the wiring patterns (1b). In this case, it is considered that good transmission characteristics for signals of high frequencies of the order of several GHz can be obtained in the wiring patterns (1b) while infiltration of a liquid into the interfaces between the conductor pads (1a) and the second insulating layer 22 is substantially reliably prevented.

The first surface roughness may be 200% or more and 1200% or less of the second surface roughness. In this case, it is considered that a roughening process of the surfaces (1a1) of the conductor pads (1a) does not require an excessive time, and damage to the first insulating layer 21 and the like during the roughening process is small. The first surface roughness of the surfaces (1a1) of the conductor pads (1a) is, for example, 0.3 μm or more and 0.6 μm or less in terms of arithmetic mean roughness (Ra). Further, the second surface roughness of the surfaces (1b1) of the wiring patterns (1b) is, for example, 0.05 μm or more and 0.15 μm or less in terms of arithmetic mean roughness (Ra). That is, the arithmetic mean roughness (Ra) of the surfaces (1a1) of the conductor pads (1a) is more than twice the arithmetic mean roughness (Ra) of the surfaces (1b1) of the wiring patterns (1b).

In the example of FIG. 3, of the coating film 5 covering the surfaces (1a1) of the conductor pads (1a), a surface facing the second insulating layer 22 has undulations based on the unevenness of the surfaces (1a1). It is considered that, as compared to a case where the surface of the coating film 5 is flat, a contact area between the coating film 5 and the second insulating layer 22 is increased. It may be possible that, in addition to an adhesion improvement effect due to the coating film 5, an adhesion improvement effect due to the increase in contact area can be obtained.

On the other hand, the coating film 5 is not interposed between the surfaces (1a2) of the conductor pads (1a) covered by the connection conductors 4 and the connection conductors 4. That is, the conductor pads (1a) are in direct contact with the connection conductors 4. For example, without intervention of an organic material such as a silane coupling agent, a metal such as copper that forms the conductor pads (1a) and a metal such as copper that forms the connection conductors 4 are in direct contact with each other at the interfaces between the conductor pads (1a) and the connection conductors 4. Therefore, it is considered that, at the interfaces between the conductor pads (1a) and the connection conductors 4, a mechanically strong metal-to-metal bond with a low electrical resistance is obtained.

In the example of FIG. 3, the surface (1c1) of the flat plate-shaped conductor pattern (1c) facing the second insulating layer 22 has a lower surface roughness than the first surface roughness of the surfaces (1a1) of the conductor pads (1a). The surface (1c1) does not have to be roughened in a process that is actively provided for roughening the surface (1c1). The surface (1c1) of the conductor pattern (1c) in the example of FIG. 3 has substantially the same surface roughness as the surface roughness (second surface roughness) of the surfaces (1b1) of the wiring patterns (1b). The surface (1c1) of the conductor pattern (1c) may have the second surface roughness. Therefore, it is considered that good high-frequency transmission characteristics can also be obtained in the conductor pattern (1c). On the other hand, an anchor effect obtained on the surface (1c1) of the conductor pattern (1c) is presumed to be small. However, as described above, the surface (1c1) of the conductor pattern (1c) is covered by the coating film 5. It is considered that interfacial peeling between the conductor pattern (1c) and the second insulating layer 22, where adhesion is enhanced by the coating film 5, is unlikely to occur.

In the wiring substrate 100, as illustrated in FIG. 4, the surfaces (1a2) of the conductor pads (1a) covered by the connection conductors 4 have a lower surface roughness (third surface roughness) than the first surface roughness of the surfaces (1a1) of the conductor pads (1a). The third surface roughness is higher than the second surface roughness of the surfaces (1b1) of the wiring patterns (1b) illustrated in FIG. 3. The surfaces (1a2) are not in contact with a resin such as the second insulating layer 22, and are not "surfaces of transmission paths" where currents are concentrated due to a skin effect. Therefore, neither large unevenness nor flatness is particularly required for the surfaces (1a2). Therefore, as illustrated in FIGS. 3 and 4, the surfaces (1a2) of the conductor pads (1a) can have any surface roughness (third surface roughness) between the first surface roughness of the surfaces (1a1) of the conductor pads (1a) and the second surface roughness of the surfaces (1b1) of the wiring patterns (1b).

FIGS. 5A-5D illustrate other examples of the wiring substrate of the present embodiment. FIGS. 5A-5D are enlarged views of portions corresponding to the portion (III) of FIG. 1 in the other examples of the wiring substrate of the present embodiment. In the example of FIG. 5A, the surface (1c1) of the flat plate-shaped conductor pattern (1c) facing the second insulating layer 22 is roughened to have a surface roughness higher than the surface roughness (second surface roughness) of the surfaces (1b1) of the wiring patterns (1b). In the example of FIG. 5A, the surface (1c1) has substantially the same surface roughness as the surfaces (1a1) of the conductor pads (1a). In this way, the surface (1c1) of the conductor pattern (1c) may be roughened to have the first surface roughness similar to the surfaces (1a1) of the conductor pads (1a). For example, when high frequency signals are not transmitted in the conductor pattern (1c), it is considered that the high surface roughness of the surface (1c1) does not pose a particular problem.

In the example of FIG. 5A, the surface (1c1) of the conductor pattern (1c) is covered by the coating film 5 similar to that in the example of FIG. 3. And, the surface of the coating film 5 covering the surface (1c1) has undulations based on the unevenness of the surface (1c1). It may be possible that, in addition to an adhesion improvement effect due to the coating film 5, an adhesion improvement effect due to an increase in contact area can be obtained.

In the example of FIG. 5A, the surfaces (1a2) of the conductor pads (1a) covered by the connection conductors 4 have substantially the same surface roughness as the surface roughness (first surface roughness) of the surfaces (1a1) of the conductor pads (1a) facing the second insulating layer 22. However, as described above, the surfaces (1a2) are not "surfaces of transmission paths" where a skin effect acts. Therefore, in particular, a problem such as deterioration in high-frequency transmission characteristics is unlikely to occur. On the other hand, it is presumed that, due to the high surface roughness of the surfaces (1a2), a higher anchor effect between the conductor pads (1a) and the connection conductors 4 is obtained.

In the example of FIG. 5B, only the surfaces (1b1) of the wiring patterns (1b) are covered by the coating film 5, and the surfaces (1a1) of the conductor pads (1a) and the surface (1c1) of the conductor pattern (1c) are not covered by the coating film. That is, the surfaces (1a1) of the conductor pads (1a) are in direct contact with the second insulating layer 22 without intervention of the coating film 5. Further, the surface (1c1) of the conductor pattern (1c) is in direct contact with the second insulating layer 22 without intervention of the coating film 5. On the other hand, similar to that in the example of FIG. 5A, the surfaces (1a1) of the conductor pads (1a) and the surface (1c1) of the conductor pattern (1c) all have the surface roughness (first surface roughness) higher than the surface roughness (second surface roughness) of the surfaces (1b1) of the wiring patterns (1b). Therefore, it is considered that, since a sufficient anchor effect can be obtained between the conductor pads (1a) and the second insulating layer 22 and between the conductor pattern (1c) and the second insulating layer 22, interfacial peeling is unlikely to occur.

In the example of FIG. 5C, similar to that in the example of FIG. 5B, the surfaces (1a1) of the conductor pads (1a) are not covered by the coating film 5 and have a surface roughness (first surface roughness) higher than the surface roughness of the surfaces (1b1) of the wiring patterns (1b). It is considered that, since a sufficient anchor effect is obtained between the conductor pads (1a) and the second insulating layer 22, interfacial peeling is unlikely to occur. Similar to the examples of FIG. 3 and FIGS. 5A and 5B referenced above, the wiring patterns (1b) have a lower surface roughness (second surface roughness) than the surfaces (1a1) of the conductor pads (1a) and are covered by the coating film 5. It is considered that good high-frequency transmission characteristics are obtained and an effect of improving adhesion to the second insulating layer 22 by the coating film 5 is obtained.

On the other hand, the surface (1c1) of the conductor pattern (1c) in the example of FIG. 5C has a surface roughness lower than the first surface roughness of the surfaces (1a1) of the conductor pads (1a), and is covered by the coating film 5. The surface (1c1) of the conductor pattern (1c) in the example of FIG. 5C can also have the second surface roughness, similar to the surfaces (1b1) of the wiring patterns (1b). Therefore, it is considered that, even in the conductor pattern (1c) of FIG. 5C, good high-frequency transmission characteristics are obtained and an effect of improving adhesion to the second insulating layer 22 by the coating film 5 is obtained.

As illustrated in FIGS. 5A-5C, in the present embodiment, as long as the surfaces (1a1) of the conductor pads (1a) facing the second insulating layer 22 have a higher surface roughness than the surfaces (1b1) of the wiring patterns (1b), the surfaces (1a1) may or may not be covered by the coating film 5. Further, the surface (1c1) of the conductor pattern (1c) also may or may not be covered by the coating film 5. Further, the surface (1c1) may have the same surface roughness as the surfaces (1a1) of the conductor pads (1a), or may have the same surface roughness as the surfaces (1b1) of the wiring patterns (1b).

In the example of FIG. 3 and FIGS. 5A-5C, the coating film 5 covers only a part or all of the surface of the first conductor layer 11 and does not cover a surface of the first insulating layer 21. However, as in the another example of the wiring substrate of the embodiment illustrated in FIG. 5D, the coating film 5 may cover the surface of the first insulating layer 21. The coating film 5 of the example of FIG. 5D also covers a surface (21a) of the first insulating layer 21 that is not covered by the first conductor layer 11, in addition to the surfaces (1a1) of the conductor pads (1a), the surfaces (1b1) of the wiring patterns (1b), and the surface (1c1) of the conductor pattern (1c). In this way, the coating film 5 may cover the exposed surface of the first insulating layer 21.

The coating film 5 may cover the entire exposed surface of the first insulating layer 21. The coating film 5 may cover the entire exposed surface of the first insulating layer 11 and the entire surface of the first conductor layer 11 facing the second insulating layer 22. In this case, since an end surface of the coating film 5 does not exist on the first insulating layer 21, it is considered that peeling of the coating film 5 starting from the end surface is unlikely to occur. In FIGS. 5A-5D, a structural element that is the same as a structural element illustrated in FIG. 3 is indicated using the same reference numeral symbol as the one used in FIG. 3 or is omitted as appropriate, and a repetitive description of the same structural element is omitted.

Next, a method for manufacturing the wiring substrate of the embodiment is described with reference to FIGS. 6A-6H using the wiring substrate 100 of FIG. 1 as an example.

Figure 6A:
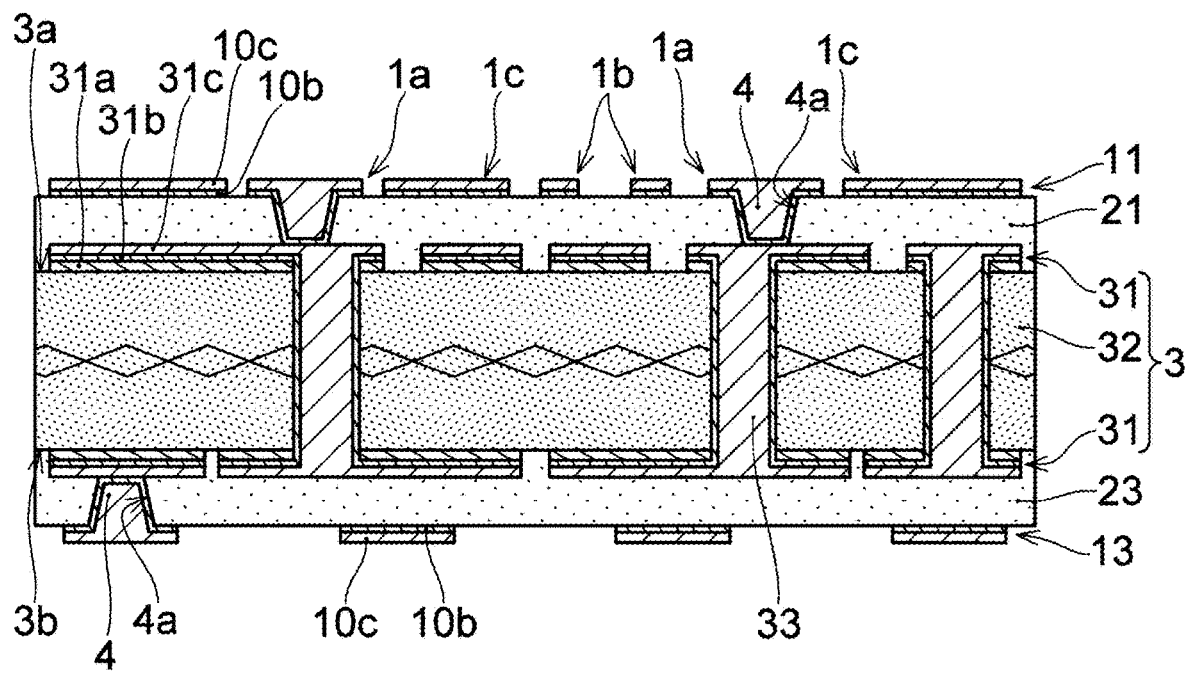
FIG. 6A is a cross-sectional view illustrating an example of a manufacturing process of a wiring substrate according to an embodiment of the present invention.

As illustrated in FIG. 6A, a starting substrate (for example, a double-sided copper-clad laminated plate) that includes an insulating layer, which is to become the insulating layer 32 of the core substrate 3, and the metal foils (31a) that are respectively laminated on both sides of the insulating layer is prepared, and the conductor layers 31 and the connection conductors 33 of the core substrate 3 are formed. For example, through holes are formed at formation positions of the connection conductors 33 by drilling or irradiation of $CO_2$ laser, and the metal film (31b) is formed in the through holes and on the metal foils (31a) by electroless plating or sputtering. Then, the plating film (31c) is formed by electrolytic plating using the metal film (31b) as a power feeding layer. As a result, the conductor layers 31 having a three-layer structure, and the connection conductors 33 having a two-layer structure, are formed. After that, the core substrate 3 having predetermined conductor patterns is obtained by patterning the conductor layers 31 using a subtractive method.

Then, as illustrated in FIG. 6A, the first insulating layer 21 and the insulating layer 23 are respectively formed on the first surface (3a) and the second surface (3b) of the core substrate 3. In forming each of the first insulating layer 21 and the insulating layer 23, for example, a film-like epoxy resin is laminated on the core substrate 3 and is heated and pressed. As a result, the first insulating layer 21 and the insulating layer 23 are formed. The first insulating layer 21 and the insulating layer 23 can be formed using any resin such as a BT resin or a phenol resin without being limited to using a film-like epoxy resin. In the first insulating layer 21 and the insulating layer 23, the through holes (4a) for forming the connection conductors 4 are formed by, for example, irradiation of $CO_2$ laser.

The method for manufacturing the wiring substrate of the present embodiment includes, as illustrated in FIG. 6A, forming the first conductor layer 11 having the conductor pads (1a) and the wiring patterns (1b). In the example of FIG. 6A, the first conductor layer 11 including the conductor patterns (1c) in addition to the conductor pads (1a) and wiring patterns (1b) is formed. The conductor layer 13 is formed on the second surface (3b) side of the core substrate 3. The connection conductors 4 are formed in the first insulating layer 21 and the insulating layer 23. The first conductor layer 11, the conductor layer 13, and the connection conductors 4 are formed using, for example, a semi-additive method. That is, the metal film (10b) is formed in the through holes (4a) and on the surfaces of the first insulating layer 21 and the insulating layer 23, for example, by electroless plating or sputtering.

A plating resist (not illustrated in the drawings) having openings corresponding to the conductor pads (1a), the wiring patterns (1b), and the conductor pattern (1c), or openings corresponding to conductor patterns to be included in the conductor layer 13 is formed on the metal film (10b). Then, the plating film (10c) is formed in the openings of the plating resist by electrolytic plating using the metal film (10b) as a power feeding layer. As a result, the first conductor layer 11 and the conductor layer 13, which are formed of the metal film (10b) and the plating film (10c), are formed. The connection conductors 4, which are formed of the metal film (10b) and the plating film (10c), are formed in the through holes (4a). After that, the plating resist is removed, for example, using an alkaline peeling agent such as sodium hydroxide. After that, a portion of the metal film (10b) that is exposed without being covered by the plating film (10c) is removed by etching or the like.

Figure 6B:
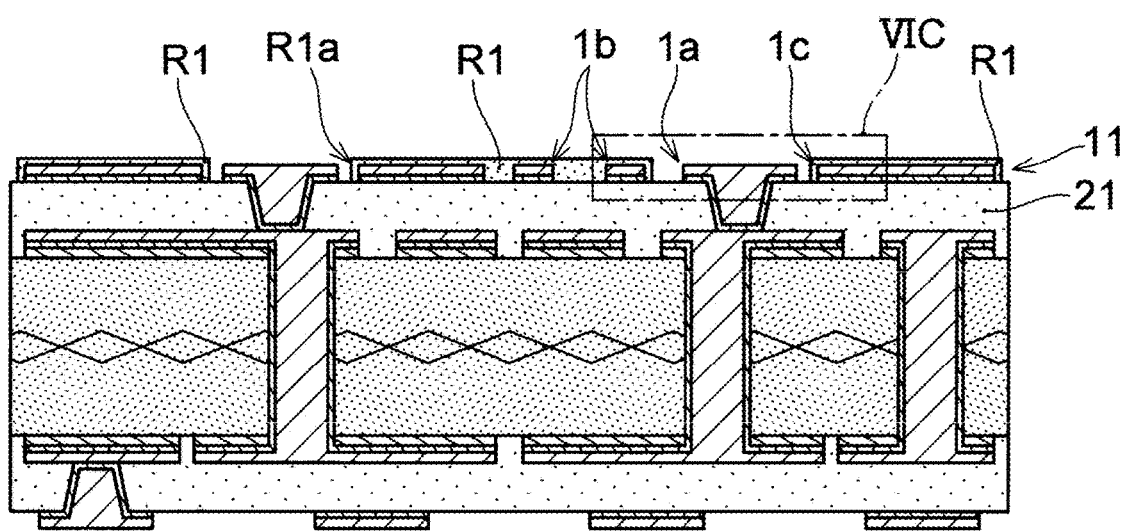
FIG. 6B is a cross-sectional view illustrating an example of a manufacturing process of a wiring substrate according to an embodiment of the present invention.
Figure 6C:
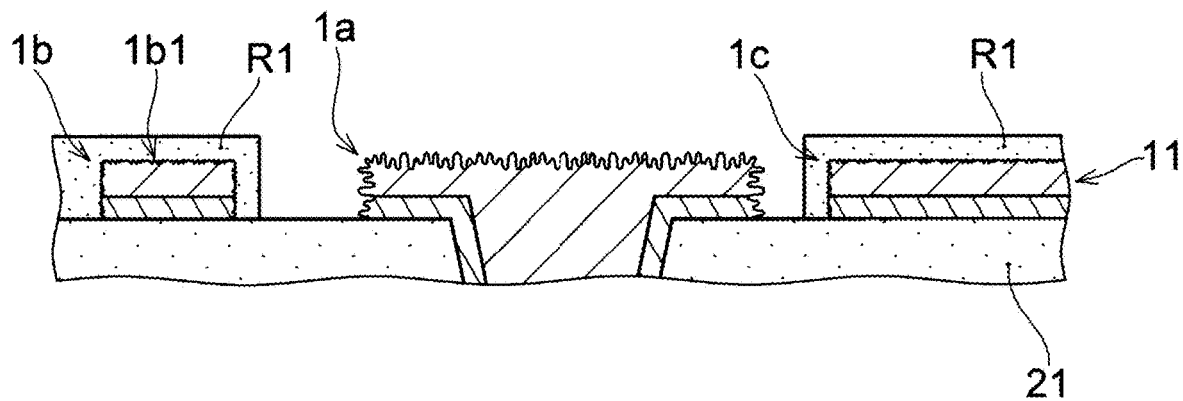
FIG. 6C is a cross-sectional view illustrating an example of a manufacturing process according to a wiring substrate according to an embodiment of the present invention.

The method for manufacturing the wiring substrate of the present embodiment includes, as illustrated in FIGS. 6B and 6C, roughening an exposed surface, which is a region of the surface of the first conductor layer 11 that is not in contact with the first insulating layer 21. However, in the method for manufacturing the wiring substrate of the present embodiment, exposed surfaces of the wiring patterns (1b) are not roughened in the roughening of the exposed surface of the first conductor layer 11. On the other hand, exposed surfaces of the conductor pads (1a) are roughened. Therefore, as illustrated in FIG. 6B, a resist film (R1) covering the wiring patterns (1b) is provided. Thus, the roughening of the exposed surface of the first conductor layer 11 may include providing the resist film (R1) that covers the wiring patterns (1b).

The roughening of the exposed surface of the first conductor layer 11 can be performed using any method. For example, the portion of the exposed surface of the first conductor layer 11 that is not covered by the resist film (R1) is roughened by a surface oxidation treatment called a blackening treatment or a browning treatment or by a microetching treatment using an acidic solvent.

In the wiring substrate 100 of FIG. 1, the surface of the conductor pattern (1c) is not roughened. Therefore, in the example of FIG. 6B, the resist film (R1) is provided so as to also cover the conductor pattern (1c). The resist film (R1) is formed, for example, by laminating a film containing a photosensitive resin. Openings (R1a) exposing the conductor pads (1a) and the like are provided in the resist film (R1) using a photolithography technology such as exposure and development. The resist film (R1) may be formed of the same material as that of the plating resist (not illustrated in the drawings) used in the formation of the first conductor layer 11 described above.

As illustrated in FIG. 6C, the exposed surfaces of the conductor pads (1a) are roughened. FIG. 6C is an enlarged view of the exposed surface of the first conductor layer 11 in a portion (VIC) of FIG. 6B after the roughening treatment. The exposed surfaces of the conductor pads (1a) are roughened to have at least a surface roughness higher than the surface roughness (second surface roughness) of the unroughened surfaces (1b1) of the wiring patterns (1b). The exposed surfaces of the conductor pads (1a) are roughened, for example, to have a surface roughness of 0.3 μm or more and 0.6 μm or less in terms of arithmetic mean roughness (Ra).

Figure 6D:
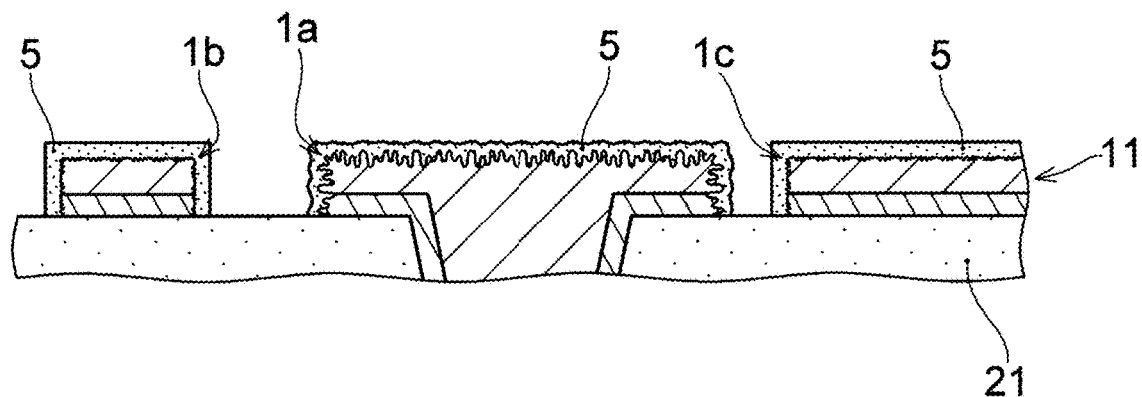
FIG. 6D is a cross-sectional view illustrating an example of a manufacturing process of a wiring substrate according to an embodiment of the present invention.

As illustrated in FIG. 6D, the method for manufacturing the wiring substrate of the present embodiment further includes providing the coating film 5 on the exposed surface of the first conductor layer 11. FIG. 6D illustrates a state after the formation of the coating film 5 for the same portion as FIG. 6C. In the example of FIG. 6D, the coating film 5 is provided on the entire exposed surface of the first conductor layer 11 including the exposed surfaces of the conductor pads (1a), the exposed surfaces of the wiring patterns (1b), and the exposed surface of the conductor pattern (1c). In the present embodiment, as will be described later, it is also possible that the coating film 5 is provided on a part of the exposed surface of the first conductor layer 11.

The coating film 5 improves the adhesion between the first conductor layer 11 and the second insulating layer 22 (see FIG. 6E) formed in a subsequent process. The coating film 5 is formed, for example, by immersion of the first conductor layer 11 in a liquid containing a material such as a silane coupling agent that can bind to both an organic material and inorganic material, or by spraying of such a liquid. However, a method for forming the coating film 5 is arbitrary, and is not limited to immersion in a material forming the coating film 5 or spraying of such a material.

Figure 6E:
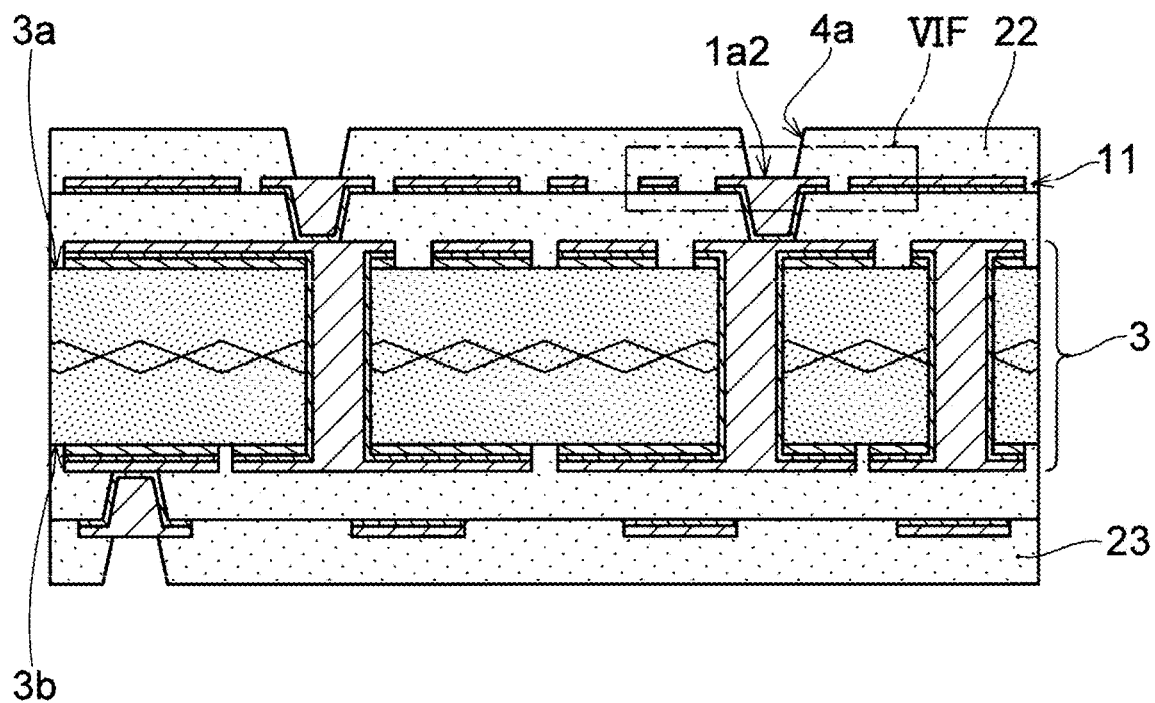
FIG. 6E is a cross-sectional view illustrating an example of a manufacturing process of a wiring substrate according to an embodiment of the present invention.
Figure 6F:
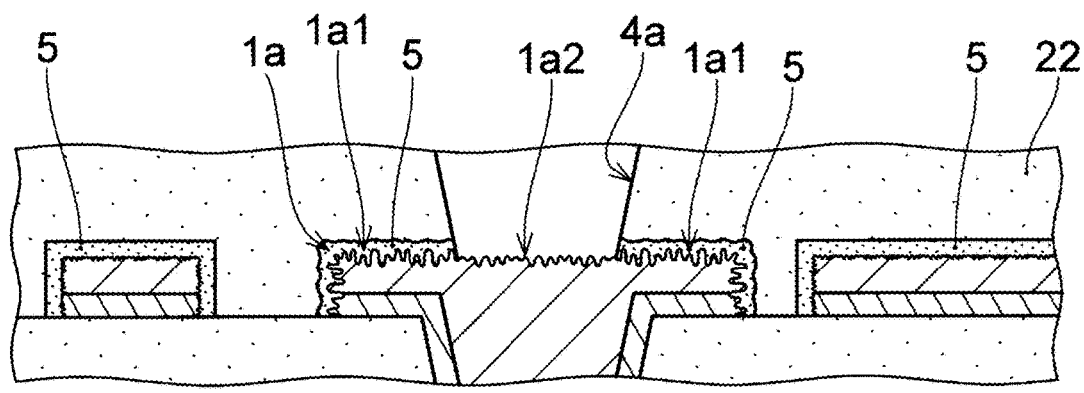
FIG. 6F is a cross-sectional view illustrating an example of a manufacturing process of a wiring substrate according to an embodiment of the present invention.

As illustrated in FIGS. 6E and 6F, the method for manufacturing the wiring substrate of the present embodiment further includes forming the second insulating layer 22 that covers the first conductor layer 11. The insulating layer 23 is further formed on the second surface (3b) side of the core substrate 3. FIG. 6F illustrates an enlarged view of a portion (VIF) of FIG. 6E. As illustrated in FIG. 6F, the second insulating layer 22 also covers the coating film 5. Similar to the first insulating layer 21, the second insulating layer 22 and the insulating layer 23 are each formed, for example, by laminating a film-like epoxy resin and applying heat and pressure thereto.

In the second insulating layer 22 and the insulating layer 23, the through holes (4a) for forming the connection conductors 4 (see FIG. 6G) in a subsequent process are formed, for example, by irradiation of $CO_2$ laser. The through holes (4a) are formed in regions on the conductor pads (1a) in the second insulating layer 22. Due to the through holes (4a), portions (the surfaces (1a2)) of the surfaces of the conductor pads (1a) are exposed.

In the example of FIG. 6F, the coating film 5 formed on the surfaces (1a2) of the conductor pads (1a) exposed in the through holes (4a) due to the formation of the through holes (4a) is removed. The coating film 5 formed on the surfaces (1a2) is, for example, melted and vaporized, or sublimated, by being irradiated with laser during the formation of the through holes (4a). As a result, the coating film 5 formed on the surfaces (1a2) can be removed. As in the example of FIG. 6F, the method for manufacturing the wiring substrate of the present embodiment may include removing the coating film 5 from the surfaces (1a2) of the conductor pads (1a). By removing the coating film 5 from the surfaces (1a2), the connection conductors 4, which are formed on the conductor pads in a subsequent process, and the conductor pads (1a) can be bonded firmly with metal-to-metal bonding and with a low electrical resistance.

Infiltration of a dissolving solution of the coating film 5 during the removal of the coating film 5 into the interfaces between the conductor pads (1a) and the second insulating layer 22 is hindered by the unevenness of the surfaces (1a1) of the conductor pads (1a), which are roughened to have a relatively high surface roughness as described above. It may be possible that interfacial peeling between the conductor pads (1a) and the second insulating layer 22 is prevented.

Further, in the example of FIG. 6F, due to irradiation of laser during the formation of the through holes (4a), heights of convex parts of the unevenness of the surfaces (1a2) of the conductor pads (1a) is lower as compared to those before the formation of the through holes (4a). For example, due to irradiation of laser during the formation of the through holes (4a), the convex parts of the unevenness of the surfaces (1a2) are rounded or melted. As a result, the surface roughness of the surfaces (1a2) is lower as compared to that before the formation of the through holes (4a). As in the example of FIG. 6F, the method for manufacturing the wiring substrate of the present embodiment may include reducing the surface roughness of the surfaces (1a2), which are portions of the surfaces of the conductor pads (1a). The surfaces (1a2) are portions of the surfaces of the conductor pads (1a) that are connected to the connection conductors 4 to be described later.

After the formation of the through holes (4a), preferably, a desmear treatment is performed in which resin residues (smears) generated by the formation of the through holes (4a) are removed. For example, the smears in the through holes (4a) are removed by exposing inner walls of the through holes (4a) to a treatment liquid such as an alkaline permanganate solution. Infiltration of a processing liquid for the desmear treatment into the interfaces between the conductor pads (1a) and the second insulating layer 22 is hindered by the unevenness of the roughened surfaces (1a1) of the conductor pads (1a). It is considered that defects such as dissolution of the coating film 5 on the surfaces (1a1) due to the processing liquid and interfacial peeling associated with the dissolution are prevented.

Figure 6G:
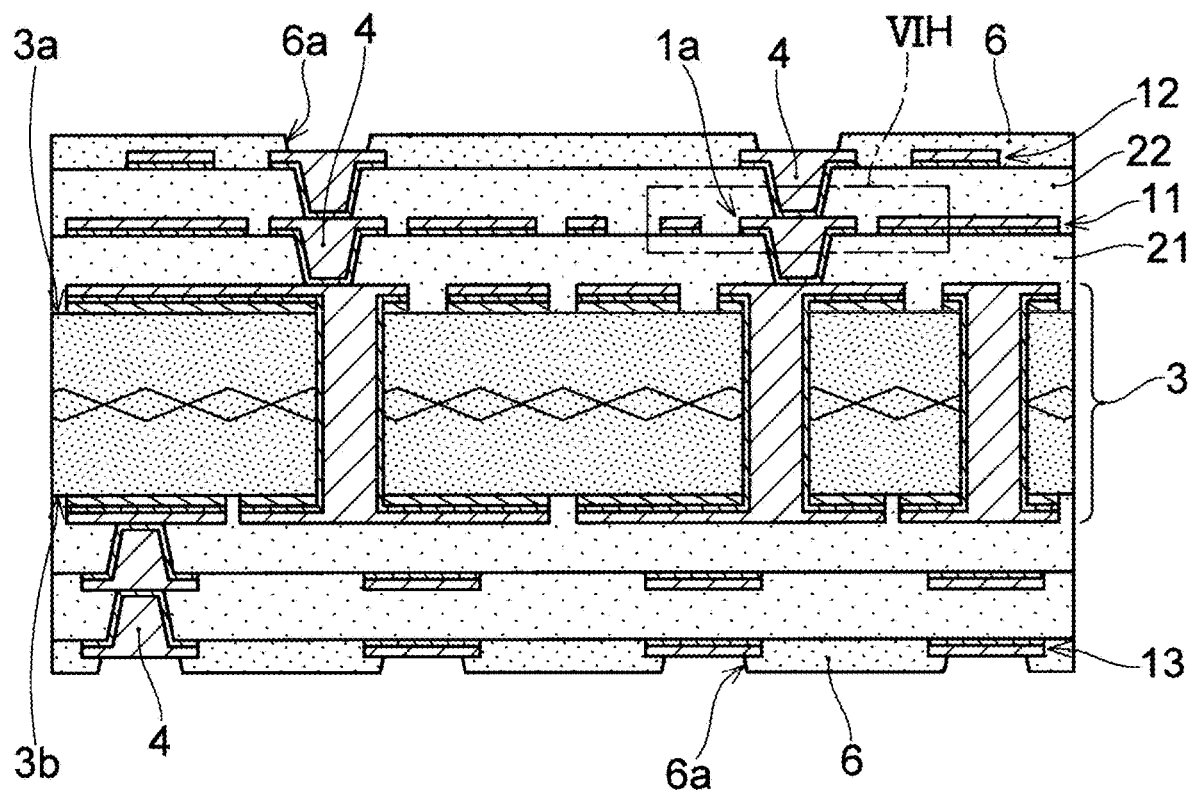
FIG. 6G is a cross-sectional view illustrating an example of a manufacturing process of a wiring substrate according to an embodiment of the present invention.
Figure 6H:
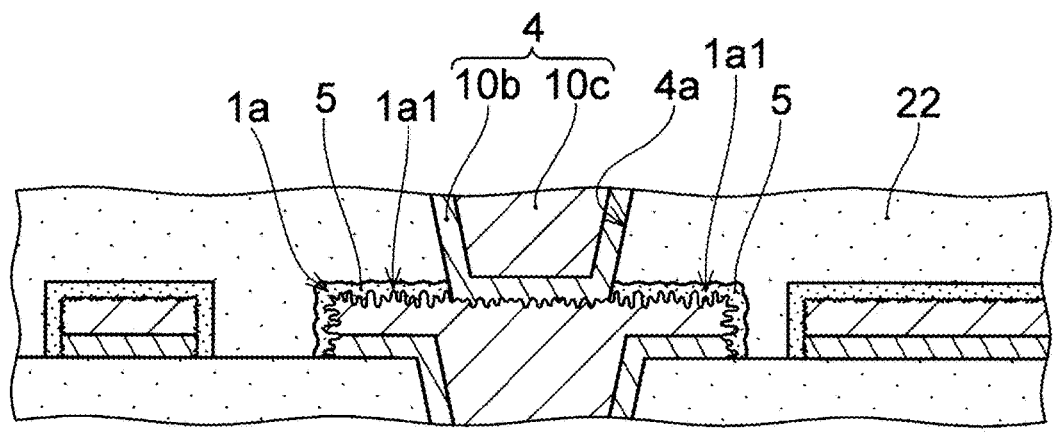
FIG. 6H is a cross-sectional view illustrating an example of a manufacturing process of a wiring substrate according to an embodiment of the present invention.

As illustrated in FIGS. 6G and 6H, the method for manufacturing the wiring substrate of the present embodiment includes forming the second conductor layer 12 on the second insulating layer 22, and forming the connection conductors 4 that penetrate the second insulating layer 22 and connect the conductor pads (1a) and the second conductor layer 12. On the second surface (3b) side of the core substrate 3, the conductor layer 13 and the connection conductors 4 are further formed. FIG. 6H illustrates an enlarged view of a portion (VIH) of FIG. 6G.

The second conductor layer 12 and the connection conductors 4 that penetrate the second insulating layer 22 are formed, for example, using the same method as the above-described method for forming the first conductor layer 11 and the connection conductors 4 that penetrate the first insulating layer 21. For example, the second conductor layer 12 and the connection conductors 4 that penetrate the second insulating layer 22, and the conductor layer 13 and the connection conductors 4 that are further formed on the second surface (3b) side of the core substrate 3, are formed using a semi-additive method.

In the example of FIG. 6G in which the wiring substrate 100 is manufactured, the solder resists 6 are formed. The solder resists 6 are provided with the openings (6a) each of which exposes a part of the second conductor layer 12 or a part of the conductor layer 13. The solder resists 6 and the openings (6a) are formed, for example, by forming a resin layer containing a photosensitive epoxy resin or polyimide resin or the like, and performing exposure and development using a mask having appropriate opening patterns.

In the formation of the connection conductors 4 in the second insulating layer 22 using a semi-additive method, as illustrated in FIG. 6H, the metal film (10b) is formed in the through holes (4a) by, for example, electroless plating, and the plating film (10c) is formed by electrolytic plating. In the method for manufacturing the wiring substrate of the present embodiment, infiltration of a plating solution during the formation of the metal film (10b) into the interfaces between the conductor pads (1a) and the second insulating layer 22 is hindered by the unevenness of the roughened surfaces (1a1) of the conductor pads (1a). It is considered that defects such as dissolution of the coating film 5 on the surfaces (1a1) due to the plating solution and interfacial peeling associated with the dissolution are prevented.

Through the above processes, the wiring substrate 100 in the example of FIG. 1 is completed. A surface protective film (not illustrated in the drawings) may be formed on a surface of a part of the second conductor layer 12 or the conductor layer 13 by electroless plating, solder leveling, spray coating, or the like.

Figure 7A:
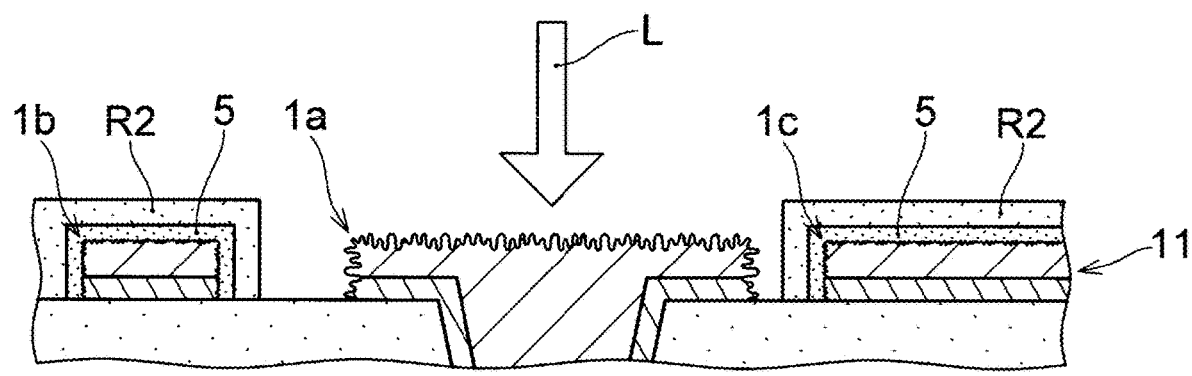
FIG. 7A is a cross-sectional view illustrating another example of a manufacturing process of a wiring substrate according to an embodiment of the present invention.

As illustrated in FIG. 7A, the method for manufacturing the wiring substrate of the present embodiment may further include removing the coating film 5 covering the conductor pads (1a) prior to the formation of the second insulating layer 22. FIG. 7A illustrates an example in which, after the formation of the coating film 5 illustrated in FIG. 6D referenced above, the coating film 5 covering the conductor pads (1a) is removed by irradiation of laser (L). By removing the coating film 5 on the conductor pads (1a) prior to the formation of the second insulating layer 22, infiltration of a dissolving solution of the coating film 5 into the interfaces between the conductor pads (1a) and the second insulating layer 22 during the formation of the through holes (4a) (see FIG. 6F) can be fundamentally prevented.

Examples of the laser used for removing the coating film 5 include CO2 laser, YAG laser, and the like. However, the laser used for removing the coating film 5 is not limited to these. Further, the method for removing the coating film 5 on the conductor pads (1a) is not limited to irradiation of laser. For example, the coating film 5 may be removed by a plasma treatment. When the coating film 5 on the conductor pads (1a) is removed, as illustrated in FIG. 7A, a resist film (R2) that covers the conductor patterns (the wiring patterns (1b) and the conductor pattern (1c)) of the first conductor layer 11 other than the conductor pads (1a) may be provided.

In the example of FIG. 6D referenced above, the coating film 5 is provided on all of the exposed surfaces of the first conductor layer 11. However, in the method for manufacturing the wiring substrate of the present embodiment, when the coating film 5 is formed, the coating film 5 may be provided only on a part of the exposed surface of the first conductor layer 11 without being provided on the exposed surfaces of the conductor pads (1a). In this case, the coating film 5 may be provided only on the exposed surfaces of the wiring patterns (1b) and the exposed surface of the conductor pattern (1c).

Figure 7B:
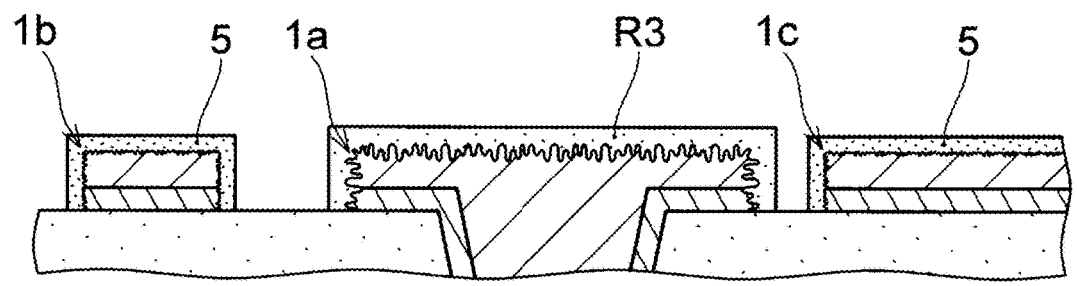
FIG. 7B is a cross-sectional view illustrating another example of a manufacturing process of a wiring substrate according to an embodiment of the present invention.

FIG. 7B illustrates an example in which, when the coating film 5 is formed, the coating film 5 is provided on the exposed surfaces of the wiring patterns (1b) and the conductor pattern (1c) without being provided on the exposed surfaces of the conductor pads (1a). As illustrated in FIG. 7B, a resist film (R3) covering the conductor pads (1a) is formed. As a result, the coating film 5 is provided only on the exposed surfaces of the wiring patterns (1b) and the conductor pattern (1c). Thus, in the case where the coating film 5 is not formed on the conductor pads (1a) when the coating film 5 is formed, the above-described infiltration of a dissolving solution of the coating film 5 into the interfaces between the conductor pads (1a) and the second insulating layer 22 can be fundamentally prevented, and the above-described process for removing the coating film 5 can be omitted.

When the wiring substrate 100 in the example illustrated in FIG. 5A referenced above is manufactured, in the process illustrated in FIG. 6C, the exposed surface of the first conductor layer 11 is roughened without providing the resist film (R1) that covers the conductor pattern (1c). As a result, the surface (1c1) of the conductor pattern (1c) is also roughened so as to have substantially the same surface roughness as the exposed surfaces of the conductor pads (1a). By adjusting the power of the laser during the formation of the through holes (4a) (see FIG. 6F), the surface roughness of the surfaces (1a2) of the conductor pads (1a) exposed in the through holes (4a) can be maintained to be substantially the same as the surface roughness of the surfaces (1a1) without being lowered.

Further, when the wiring substrate 100 in the example of FIG. 5B referenced above is manufactured, in the process illustrated in FIG. 7A, the coating film 5 is removed without providing the resist film (R2) that covers the conductor pattern (1c). As a result, the coating film 5 on the surface (1c1) of the conductor pattern (1c) is also removed. Or, in the process illustrated in FIG. 7B, the resist film (R3) is also provided on the conductor pattern (1c), and the coating film 5 is formed. As a result, the coating film 5 is formed only on the surfaces (1b1) of the wiring patterns (1b).

According to the method for manufacturing the wiring substrate of the present embodiment, the surfaces of the conductor pads (1a) are roughened without roughening the surfaces (1b1) of the wiring patterns (1b). Therefore, infiltration of various liquids from the inner walls of the through holes (4a), which are for forming the connection conductors 4 that are in contact with the conductor pads (1a), into the interfaces between the conductor pads (1a) and the second insulating layer 22 is prevented by the unevenness of the surfaces of the conductor pads (1a). Therefore, it may be possible that interfacial peeling between the conductor pads (1a) and the second insulating layer 22 is prevented. On the other hand, the coating film 5 that improves the adhesion between the first conductor layer 11 and the second insulating layer 22 is formed on the surfaces (1b1) of the wiring patterns (1b) that are not roughened and can have good high-frequency transmission characteristics. Therefore, in the wiring patterns (1b), for example, good high-frequency transmission characteristics and sufficient adhesion to the second insulating layer 22 can be obtained. Thus, according to the method for manufacturing the wiring substrate of the present embodiment, it may be possible that desired characteristics of the wiring patterns and the adhesion between the wiring patterns and the insulating layer are ensured, and in addition, deterioration in quality of the wiring substrate due to peeling between the conductor pads, which are in contact with the connection conductors that connect the conductor layers, and the insulating layer is suppressed.

The wiring substrate of the embodiment is not limited to those having the structures illustrated in the drawings and those having the structures, shapes, and materials exemplified in the present specification. As described above, the wiring substrate of the embodiment can have any laminated structure. For example, the wiring substrate of the embodiment may be a coreless substrate that does not contain a core substrate. The wiring substrate of the embodiment can include any number of conductor layers and any number of insulating layers. The first conductor layer 11 can exist at any layer on a laminated structure of the wiring substrate. The first conductor layer 11 does not have to include the plating film (10c) formed of an electrolytic plating film, and may include, for example, only the metal film (10b) formed of an electroless plating film. Further, all or some of the multiple conductor layers included in the wiring substrate may include the conductor pads (1a), the wiring patterns (1b), and the conductor pattern (1c) as included in the first conductor layer 11. Further, the conductor pads (1a) do not have to be via pads of connection conductors that penetrate an insulating layer (the first insulating layer 21 in the wiring substrate 100) below the first conductor layer 11.

The method for manufacturing the wiring substrate of the embodiment is not limited the method described with reference to the drawings. For example, the first and second conductor layers (11, 12) may be formed using a full additive method. Further, the first and second insulating layers (21, 22) can be formed using a resin in any form without being limited to a film-like resin. Further, it is also possible that the connection conductors are not formed in the insulating layers other than the second insulating layer 22. In the method for manufacturing the wiring substrate of the embodiment, it is also possible that any process other than the processes described above is added, or some of the processes described above are omitted.

In the method described in Japanese Patent Application Laid-Open Publication No. 2018-172759, it may be possible that the chemical conversion coating film formed on the surface of the metal wiring layer is dissolved by various treatments in subsequent processes. Therefore, in a printed wiring board manufactured using the method of Japanese Patent Application Laid-Open Publication No. 2018-172759, an unintended defect due to a dissolving solution of the chemical conversion coating film may occur, causing deterioration in quality of the printed wiring board.

A wiring substrate according to an embodiment of the present invention includes: a first conductor layer that includes predetermined conductor patterns; an insulating layer that covers the first conductor layer; a second conductor layer that is formed on the insulating layer; connection conductors that penetrate the insulating layer and connect the first conductor layer and the second conductor layer; and a coating film that is formed at least partially on a surface of the first conductor layer facing the insulating layer and improves adhesion between the first conductor layer and the insulating layer. The first conductor layer includes conductor pads in contact with the connection conductors and wiring patterns covered by the insulating layer. Surfaces of the wiring patterns facing the insulating layer are covered by the coating film. Surfaces of the conductor pads facing the insulating layer are roughened to have a first surface roughness higher than a second surface roughness of the surfaces of the wiring patterns.

A method for manufacturing a wiring substrate according to an embodiment of the present invention includes: forming a first conductor layer that includes conductor pads and wiring patterns; roughening an exposed surface of the first conductor layer; providing a coating film on a part or all of the exposed surface of the first conductor layer; forming an insulating layer that covers the first conductor layer and the coating film; and forming a second conductor layer on the insulating layer, and forming connection conductors that penetrate the insulating layer and connect the conductor pads and the second conductor layer. In the roughening of the exposed surface of the first conductor layer, exposed surfaces of the conductor pads are roughened without roughening exposed surfaces of the wiring patterns.

According to an embodiment of the present invention, it may be possible that desired characteristics of the wiring patterns and adhesion between the wiring patterns and the insulating layer are ensured, and in addition, deterioration in quality of the wiring substrate due to peeling between the conductor pads, which are in contact with the connection conductors that connect the conductor layers, and the insulating layer is suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
   a first conductor layer;
   an insulating layer formed on the first conductor layer such that the insulating layer is covering the first conductor layer;
   a second conductor layer formed on the insulating layer such that the insulating layer is formed between the first and second conductor layers;
   a plurality of connection conductors formed in the insulating layer such that the plurality of connection conductors is penetrating through the insulating layer and connecting the first conductor layer and the second conductor layer; and a coating film formed at least partially on a surface of the first conductor layer such that the coating film improves adhesion between the first conductor layer and the insulating layer, wherein the first conductor layer includes a plurality of conductor pads and a plurality of wiring patterns such that the plurality of conductor pads is in contact with the plurality of connection conductors respectively and that the wiring patterns have surfaces facing the insulating layer and covered by the coating film, and the first conductor layer is formed such that the conductor pads have roughened surfaces facing the insulating layer and having a first surface roughness that is higher than a second surface roughness of the surfaces of the wiring patterns.

2. The wiring substrate according to claim 1, wherein the coating film is formed such that the coating film is covering the roughened surfaces of the conductor pads.

3. The wiring substrate according to claim 1, wherein the first conductor layer is formed such that an arithmetic mean roughness Ra of the roughened surfaces of the conductor pads is at least twice an arithmetic mean roughness Ra of the surfaces of the wiring patterns.

4. The wiring substrate according to claim 1, wherein the first conductor layer is formed such that the conductor pads have surfaces covered by the connection conductors and having a third surface roughness that is lower than the first surface roughness and higher than the second surface roughness.

5. The wiring substrate according to claim 1, wherein the first conductor layer is formed such that a metal forming the plurality of conductor pads is in direct contact with a metal forming the plurality of connection conductors at interfaces between the conductor pads and the connection conductors without intervention of an organic material.

6. The wiring substrate according to claim 1, wherein the first conductor layer is formed such that the roughened surfaces of the conductor pads are in direct contact with the insulating layer without intervention of the coating film.

7. The wiring substrate according to claim 1, wherein the first conductor layer is formed such that the first conductor layer further includes a flat plate-shaped conductor pattern extending over a region where the plurality of conductor pads and the plurality of wiring patterns are not formed and that the flat plate-shaped conductor pattern has a surface facing the insulating layer and having the first surface roughness.

8. The wiring substrate according to claim 7, wherein the coating film is formed such that the coating film is covering the surface of the flat plate-shaped conductor pattern.

9. The wiring substrate according to claim 1, wherein the first conductor layer is formed such that the first conductor layer further includes a flat plate-shaped conductor pattern extending over a region where the plurality of conductor pads and the plurality of wiring patterns are not formed and that the flat plate-shaped conductor pattern has a surface facing the insulating layer and having the second surface roughness, and the coating film is formed such that the coating film is covering the surface of the flat plate-shaped conductor pattern.

10. The wiring substrate according to claim 2, wherein the first conductor layer is formed such that an arithmetic mean roughness Ra of the roughened surfaces of the conductor pads is at least twice an arithmetic mean roughness Ra of the surfaces of the wiring patterns.

11. The wiring substrate according to claim 2, wherein the first conductor layer is formed such that the conductor pads have surfaces covered by the connection conductors and having a third surface roughness that is lower than the first surface roughness and higher than the second surface roughness.

12. The wiring substrate according to claim 2, wherein the first conductor layer is formed such that a metal forming the plurality of conductor pads is in direct contact with a metal forming the plurality of connection conductors at interfaces between the conductor pads and the connection conductors without intervention of an organic material.

13. The wiring substrate according to claim 2, wherein the first conductor layer is formed such that the roughened surfaces of the conductor pads are in direct contact with the insulating layer without intervention of the coating film.

14. The wiring substrate according to claim 2, wherein the first conductor layer is formed such that the first conductor layer further includes a flat plate-shaped conductor pattern extending over a region where the plurality of conductor pads and the plurality of wiring patterns are not formed and that the flat plate-shaped conductor pattern has a surface facing the insulating layer and having the first surface roughness.

15. The wiring substrate according to claim 14, wherein the coating film is formed such that the coating film is covering the surface of the flat plate-shaped conductor pattern.

16. A method for manufacturing a wiring substrate, comprising:
    forming a first conductor layer comprising a plurality of conductor pads and a plurality of wiring patterns;
    roughening an exposed surface of the first conductor layer comprising the plurality of conductor pads and the plurality of wiring patterns;
    forming a coating film on at least a part of the exposed surface of the first conductor layer comprising the plurality of conductor pads and the plurality of wiring patterns;
    forming an insulating layer such that the insulating layer covers the first conductor layer and the coating film;
    forming a second conductor layer on the insulating layer such that the insulating layer is formed between the first and second conductor layers; and
    forming a plurality of connection conductors such that the plurality of connection conductors penetrates through the insulating layer and connects the conductor pads and the second conductor layer,
    wherein the roughening of the exposed surface of the first conductor layer includes roughening exposed surfaces of the conductor pads without roughening exposed surfaces of the wiring patterns.

17. The method for manufacturing a wiring substrate according to claim 16, further comprising:
    removing the coating film covering the conductor pads prior to the forming of the insulating layer.

18. The method for manufacturing a wiring substrate according to claim 16, wherein the forming of the coating film includes forming the coating film on the exposed surfaces of the wiring patterns such that the coating film is not formed on the exposed surfaces of the conductor pads.

19. The method for manufacturing a wiring substrate according to claim 16, wherein the roughening of the exposed surface of the first conductor layer includes forming a resist film such that the resist film covers the plurality of wiring patterns.

20. The method for manufacturing a wiring substrate according to claim 16, further comprising:

reducing a surface roughness of portions of surfaces of the conductor pads connected to the connection conductors.

\* \* \* \* \*